United States Patent [19]

Theriault

[11] Patent Number: 4,492,937
[45] Date of Patent: Jan. 8, 1985

[54] TERMINATED SWITCH

[75] Inventor: Gerald E. Theriault, Hopewell, N.J.

[73] Assignee: RCA Corporation, New York, N.Y.

[21] Appl. No.: 437,829

[22] Filed: Oct. 29, 1982

[51] Int. Cl.³ .............................................. H03H 7/48
[52] U.S. Cl. ..................................... 333/103; 307/243
[58] Field of Search ............... 333/101, 103, 104, 105; 307/243, 244

[56] References Cited

U.S. PATENT DOCUMENTS

| | | | |
|---|---|---|---|
| 2,958,054 | 10/1960 | Concelman | 333/105 |
| 3,223,947 | 12/1965 | Clar | 333/104 |
| 3,602,823 | 8/1971 | Carter | |
| 3,694,775 | 9/1972 | Rogers | 333/101 |
| 3,737,672 | 6/1973 | Hill et al. | |
| 3,864,527 | 2/1974 | Topping | |

OTHER PUBLICATIONS

Stachejko, *Multifunction Diode Device*, RCA Technical Notes, TN No. 957, Mar. 15, 1974.

*Primary Examiner*—Paul Gensler
*Attorney, Agent, or Firm*—E. M. Whitacre; P. M. Emanuel; L. C. Edelman

[57] ABSTRACT

Switch apparatus including first and second signal switch paths for coupling signal between one of first and second input ports and an output port. Each switch path includes a pair of series-coupled oppositely-poled diodes and a shunt diode having one electrode coupled to the junction of the diode pair, each diode being coupled to the junction by an electrode of like conductivity type. A biasing means selectively biases one of the diode pairs into conduction for coupling signal between one of the input ports and the output port concurrently with the biasing into conduction of the shunt diode coupled to the junction of the other of the diode pairs for biasing the other diode pair into non-conduction, thereby decoupling signal between the other of the input ports and the output port.

4 Claims, 1 Drawing Figure

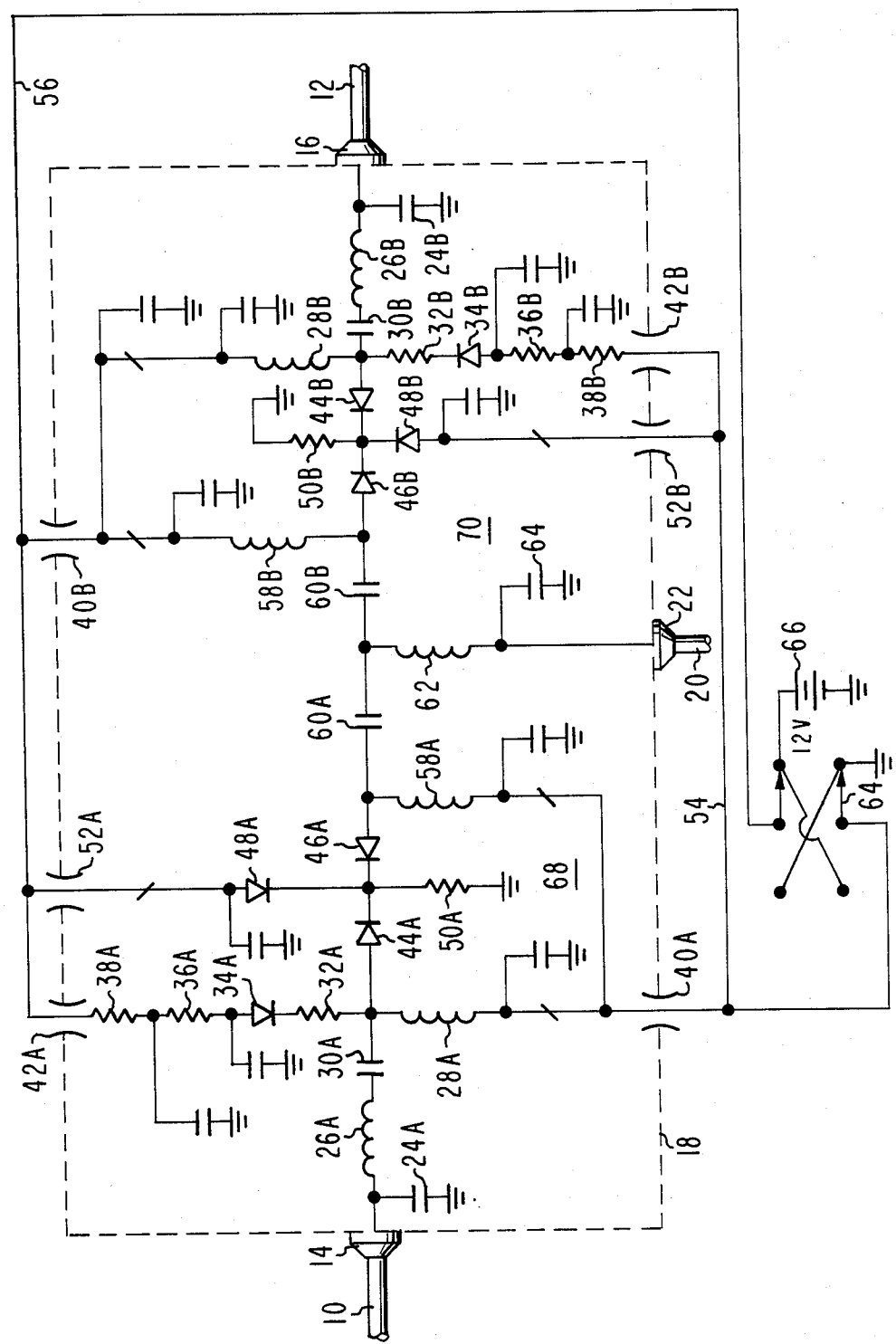

TERMINATED SWITCH

BACKGROUND OF THE INVENTION

The present invention relates to switches, and more particularly, to switches that terminate input transmission lines in their characteristic impedance.

Frequently, in television systems it is desired to couple a selected one of a plurality of input sources to an output. The input sources are coupled to the switch by a transmission line, which also has other users coupled to the line. Typically the nonselected lines are simply left open by the switch. This causes reflections on the nonselected lines, thereby resulting in ghosts in the displays of the other users.

Another problem arises from the fact that typical prior art switches are constructed using a pi-configuration of series and shunt connected diodes. When the switch is off (not passing signals), the series diodes must be reversed biased, while the shunt diodes are forward biased, and therefore conducting current. To achieve a sufficient amount of attenuation (about 62 db) between an input port and the output port when in the off-state, the back-biased series connected diodes must have a low reverse capacitance. To achieve this requires a relatively high reverse biasing voltage due to said series connection, and since the shunt diodes are conducting current, a relatively large power is used.

It is therefore desirable to provide a switch that terminates non-selected input sources in their characteristic impedance and uses relatively low switching power.

SUMMARY OF THE INVENTION

Switch apparatus including first and second signal switch paths for coupling signal between one of first and second input ports and an output port. Each switch path includes a pair of series-coupled oppositely-poled diodes and a shunt diode having one electrode coupled to the junction of the diode pair, each diode being coupled to the junction by an electrode of like conductivity type. A biasing means selectively biases one of the diode pairs into conduction for coupling signal between one of the input ports and the output port concurrently with the biasing into conduction of the shunt diode coupled to the junction of the other of the diode pairs for biasing the other diode pair into non-conduction, thereby decoupling signal between the other of the input ports and the output port.

DESCRIPTION OF THE DRAWING

The sole FIGURE is a circuit diagram of an embodiment of the invention.

DETAILED DESCRIPTION

In the drawing there is shown input coaxial lines 10 and 12 each conveying signals and usually having a characteristic impedance of 75 ohms and respectively coupled to input connectors 14 and 16 mounted on shielding box 18. Within box 18 is circuitry (described below) for selectively applying the signals from either line 10 or 12 to output connector 22, to which transmission line 20 is coupled.

The input signals from connectors 14 and 16 are respectively applied to LPFs (low pass filters) comprising capacitors 24A and 24B (4.7 pF) and inductors 26A and 26B (28 nH) respectively. The LPFs have a cutoff frequency of about 500 MHz and reduce the inherent high frequency (near the upper limit of about 400 MHz) loss of the switches when in the ON (passing signal) state due to the inherent capacity to ground of RFCs (radio frequency chokes) 28A and 28B (2.2 µH). The LPFs also help perform impedance matching near said upper limit.

From the LPFs the input signals are respectively applied to DC blocking capacitors 30A and 30B and then to the series combination of resistors 32A and 32B (68 ohms) and diodes 34A and 34B. The resistance of resistors 32 together with the forward resistance of diodes 34 provide a 75 ohm termination for lines 10 and 12 respectively when the associated switches are OFF. Only about 1 ma. of forward current is required for this, which is respectively established by resistors 36A and 36B (4.7K) and 38A and 38B (3.9K) for diodes 34A and 34B. RFCs 28A and 28B provide the bias current return and together with by-pass capacitors (unnumbered) going to ground, ferrite beads (indicated by slash marks), and feedthrough capacitors 40A, 40B, 42A, and 42B provide a decoupling of the termination circuits (32 and 34) from the switch proper.

The signals are then applied to the switch proper, which comprises left and right portions 68 and 70, respectively, including series coupled diodes 44A, 46A, and 44B and 46B and shunt diodes 48A and 48B. To achieve the required amount of attenuation, series coupled diodes 44, 46 must have a capacitance of not greater than 0.4 pF when reversed biased at 7 volts while shunt diodes 48 must have a reverse biased capacitance of not greater than 1.5 pF, forward resistance of less than 0.5 ohm, and a lead inductance of less than 3 nH. Series diodes 44, 46 can be Philips type BA 379, while shunt diodes 48 can be RCA type 1477022. Within each switch, diodes 44, 46, and 48 have their cathodes coupled together and to 1,000-ohm (1K) current determining resistors 50A and 50B respectively. The anodes of diodes 48 are coupled through feedthrough capacitors 52A and 52B respectively to supply rails 56 and 54 respectively. Again shunt by-pass capacitors (unnumbered) and beads help with decoupling. RFCs (2.2 µH) 58A and 58B respectively provide DC return for diodes 46A and 46B. Still again by-pass capacitors and ferrite beads are used to ensure decoupling. The RF signals are then applied to DC blocking capacitors (0.001 µF) 60A and 60B, only one of which capacitors carries a signal at any one time due to the action of said switches as described below. The RF signal is then applied to an impedance matching LPF comprising coil 62 (28 nH) and capacitor 64 (4.7 pF), and then to output port 22.

Supply rails 54 and 56 are coupled to the center terminals of polarity reversing DPDT switch 64 having terminals coupled to supply 66 and ground. Supply 66 can be as low as 8 volts and proper operation will still take place. Although switch 64 is shown as a mechanical switch for simplicity, in a preferred embodiment is would comprise an electronic switch, which allows remote control of the switching.

In operation, signals are applied to lines 10 and 12. Assume switch 64 is in the position shown, and therefore rail 56 is at +12 volts, while rail 54 is grounded. In left switch 68, current flows from rail 56 through resistors 38A and 36A, diode 34A, resistor 32A, and RFC 28A to rail 54 (ground). Thus, the signal at input 14 from line 10 is presented a matched condition by resistor 32A and the forward resistance of diode 34A. Current also flows from rail 56 through diode 48A and resistor 50A. Since series coupled diodes 44A and 46A have their anodes coupled to rail 54 (ground) through RFCs 28A and 58A respectively, they are automatically back biased by the positive voltage at the cathode of diode 48A, which is about about 0.7 volts below the supply voltage, on rail 56, thereby reducing the switching power required. Thus series coupled diodes 44A and 46A are OFF, while shunt diode 48a is ON, and therefore essentially none of the signal on line 10 is applied to output port 22.

In right switch 70 the positive voltage on rail 56 is applied through RFC 28B and resistor 32B to the cathode of diode 34B, while the anode of diode 34B is coupled to rail 54 (ground) through resistors 36B and 38B. Thus diode 34B is back biased, and therefore resistor 32B and diode 34B do not present a match to line 12. Current from rail 56 flows through RFCs 28B and 58B, series coupled diodes 44B and 46B, and resistor 50B. This back biases shunt diode 48B by an amount of 0.7 volts below the supply voltage since its anode is connected to rail 54 (ground). Since series coupled diodes 44B and 46B are ON, while shunt diode 48B is OFF, the signal on line 12 can flow through LPF 24B and 26B, capacitor 30B, diodes 44B and 46B, capacitor 60B, LPF 62 and 64, to output line 20. Line 20 normally is matched at its far end (not shown), obviating the need for any match at input port 16 when the signal thereat is being coupled to output 22.

When switch 64 is in the opposite position from that shown in the drawing, rail 54 is now positive, while rail 56 is now grounded. Thus the operation is the reverse of that described above, i.e., the signal at input 14 is applied to output 22, while the signal at input 16 is provided with a matched load and is blocked from output 22.

It will appreciated that the invention can be used with more than two input ports. Further, the circuit can be simplified by synthesizing all 3 LPFs by extending the leads of the series diodes 44 and 46 a sufficient amount to form LPFs with the shunt capacitance of shunt diodes 48 and the interwinding capacitance of RFCs 28 and 58.

What is claimed is:

1. Switch apparatus, comprising:
   first and second input ports and an output port;
   first and second signal switch sections for selectively coupling a signal between one of said first and second input ports, respectively, and said output port,
      said first signal switch section including a first pair of diodes each having first and second electrodes, said first and second diodes being oppositely-poled and connected in series with a first junction formed by said first electrodes, and a first shunt diode having first and second electrodes, said first electrode being coupled to said first junction;
      said second signal switch section including a second pair of diodes eaching having first and second electrodes, said first and second diodes being oppositely-poled and connected in series with a second junction formed by said first electrodes, and a second shunt diode having first and second electrodes, said first electrode being coupled to said second junction,
      said first electrodes of each diode coupled to respective ones of said first and second junctions being of the same type; and
   biasing means for selectively biasing said first and second series coupled diodes into a conductive state to selectively couple a signal between said first and second inputs, respectively, and said output port,
      said biasing means establishing a selectable bias potential between first and second conductors, said second electrodes of said first pair of series diodes being coupled to receive bias potential from said first conductor, said second electrode of said first shunt diode being coupled to receive bias potential from said second conductor, said second electrodes of said second pair of series diodes being coupled to receive bias potential from said second conductor, and said second electrode of said second shunt diode being coupled to receive bias potential from said first conductor,
      for each selective bias potential established between said first and second conductors, the diodes of one of said pairs of series-connected diodes being biased into a conductive state to couple the respective one of said input ports to said output port and the shunt diode coupled to the junction of the other of said series-connected diodes being biased concurrently into a conductive state to automatically bias the diodes of said other pair of series diodes into a non-conductive state to decouple the other of said input ports from said output port.

2. The switching apparatus of claim 1 including third and fourth shunt diodes coupled to said first and second input ports, respectively, in series with first and second resistances, respectively, and coupled between said first and second conductors for conduction concurrently with said first and second shunt diodes, for establishing a selected impedance at said first and second input ports, respectively, when the respective input ports are decoupled from said output port.

3. The switching apparatus of claim 1 further including first and second resistors coupled between said first and second junctions, respectively, and a fixed reference potential, the selective conduction of said first and second shunt diodes selectively causing bias potentials to be developed across said first and second resistors, respectively, which bias potentials automatically bias said first and second pairs of series diodes, respectively, into the non-conductive state.

4. The switching apparatus of claim 3 further including a switch means having an input port coupled to a bias potential and an output port coupled to said first and second conductors for selectively reversing the bias potential established between said conductors.

* * * * *